(12) United States Patent
Huang

(10) Patent No.: US 9,679,884 B2
(45) Date of Patent: Jun. 13, 2017

(54) ESD PROTECTING CIRCUIT

(71) Applicant: MEDIATEK INC., Hsin-Chu (TW)

(72) Inventor: Bo-Shih Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/936,685

(22) Filed: Nov. 10, 2015

(65) Prior Publication Data

US 2016/0064926 A1 Mar. 3, 2016

Related U.S. Application Data

(63) Continuation of application No. 14/451,434, filed on Aug. 5, 2014, now Pat. No. 9,214,806.

(51) Int. Cl.
*H02H 9/04* (2006.01)
*H01L 27/02* (2006.01)

(52) U.S. Cl.
CPC ...... *H01L 27/0255* (2013.01); *H01L 27/0266* (2013.01); *H02H 9/046* (2013.01)

(58) Field of Classification Search
CPC .. H01L 27/0255; H01L 27/0266; H02H 9/046
See application file for complete search history.

(56) References Cited

U.S. PATENT DOCUMENTS

| 7,242,561 | B2 | 7/2007 | Ker |
| 9,214,806 | B1 * | 12/2015 | Huang ............... H01L 27/0266 |
| 2005/0185351 | A1 | 8/2005 | Miller |

\* cited by examiner

*Primary Examiner* — Long Pham
(74) *Attorney, Agent, or Firm* — Winston Hsu

(57) ABSTRACT

An ESD protecting circuit comprising: a first and a second voltage pad; an I/O pad; a first ESD protecting module, comprising a first terminal coupled to the first voltage pad, and comprising a second terminal; a switch, comprising a first terminal coupled to the second terminal of the first ESD protecting module, comprising a second terminal coupled to the I/O pad, and comprising a control terminal for receiving a control signal; a second ESD protecting module, comprising a first terminal coupled to the first terminal of the MOS transistor, and comprising a second terminal coupled to the second voltage pad; and an ESD detecting circuit, for detecting if an ESD voltage exists, for generating the control signal to control the MOS transistor to be conductive when an ESD voltage is detected and to control the MOS transistor to be nonconductive when the ESD voltage is not detected.

15 Claims, 10 Drawing Sheets

ESD PROTECTING CIRCUIT

CROSS REFERENCE TO RELATED APPLICATION

This application is a continuation application of applicant's earlier application, Ser. No. 14/451,434, filed 2014 Aug. 5, and is included herein by reference.

BACKGROUND

ESD protecting circuit is a circuit utilized to protect an internal circuit from being damaged by an ESD voltage. FIG. 1 is a circuit diagram for a related art ESD protecting circuit 100. As shown in FIG. 1, the ESD protecting circuit 100 comprises a first ESD protecting module 101, a second ESD protecting module 103, a first voltage pad $VP_1$, a second voltage pad $VP_2$, and an I/O pad IP. The first voltage pad $VP_1$ is coupled to a first predetermined voltage $V_{DD}$ and the second voltage pad $VP_2$ is coupled to a second predetermined voltage $V_{SS}$ in a normal mode (i.e. ESD voltage does not occur). If an ESD voltage occurs, the first voltage pad $VP_1$ or the second voltage pad $VP_2$ is coupled to a ground, such that the current generated by the ESD voltage can flow through the first ESD protecting module 101 to the first voltage pad $VP_1$, or flow through the second ESD protecting module 103 to the second voltage pad $VP_2$, depending on the value of the ESD voltage. By this way, the current generated by the ESD voltage will not flow to the internal circuit such that the internal circuit can be protected. Other detail concept about the ESD protecting circuit is well known by persons skilled in the art, thus is omitted for brevity here.

However, in such structure, the swing for the signal transmitted to the internal circuit is limited to a range between the $V_{SS}$ and the $V_{DD}$.

SUMMARY

Therefore, one objective of the present invention is to provide an ESD protecting circuit that does not limit the swing for the signal.

One embodiment of the present invention discloses an ESD protecting circuit comprising: a first voltage pad; a second voltage pad; an I/O pad; a first ESD protecting module, comprising a first terminal coupled to the first voltage pad, and comprising a second terminal; a switch, comprising a first terminal coupled to the second terminal of the first ESD protecting module, comprising a second terminal coupled to the I/O pad, and comprising a control terminal for receiving a control signal; a second ESD protecting module, comprising a first terminal coupled to the first terminal of the MOS transistor, and comprising a second terminal coupled to the second voltage pad; and an ESD detecting circuit, for detecting if an ESD voltage exists, for generating the control signal to control the MOS transistor to be conductive when an ESD voltage is detected and to control the MOS transistor to be nonconductive when the ESD voltage is not detected.

In view of the abovementioned embodiment, the ESD protecting circuit can be isolated from the internal circuit such that the swing for the signal is no longer limited to a range between $V_{DD}$ and $V_{SS}$. Additionally, if a PMOS transistor is utilized as the MOS transistor, a mask for a deep N-well is no longer necessary, thus the cost can be saved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
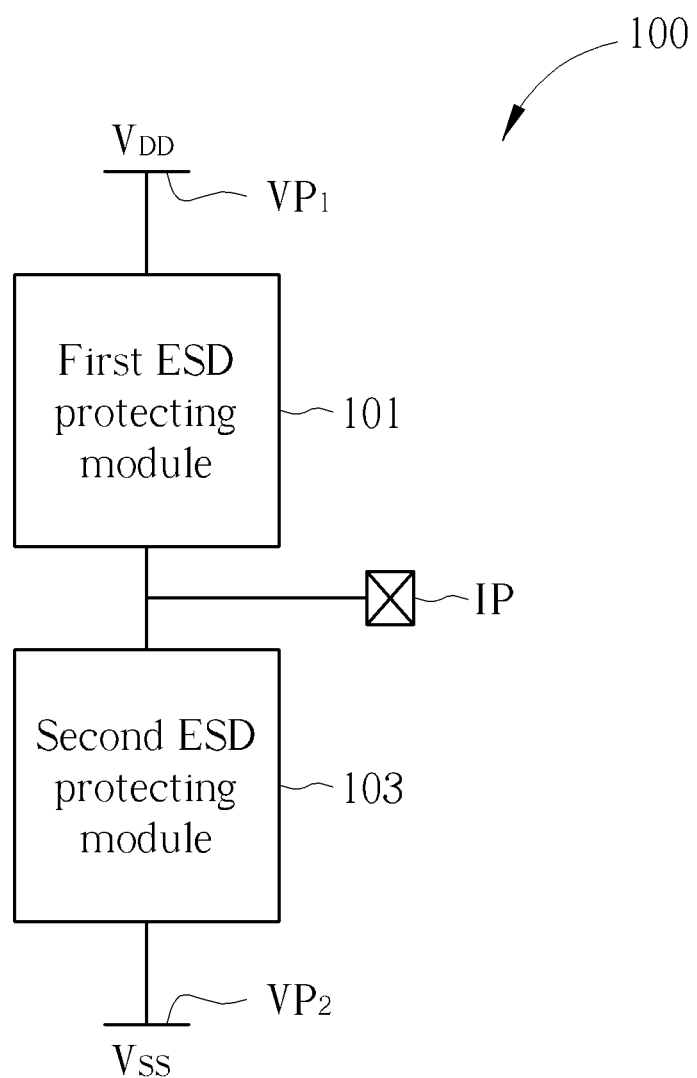
FIG. 1 is a circuit diagram for a related art ESD protecting circuit.
Figure 2:
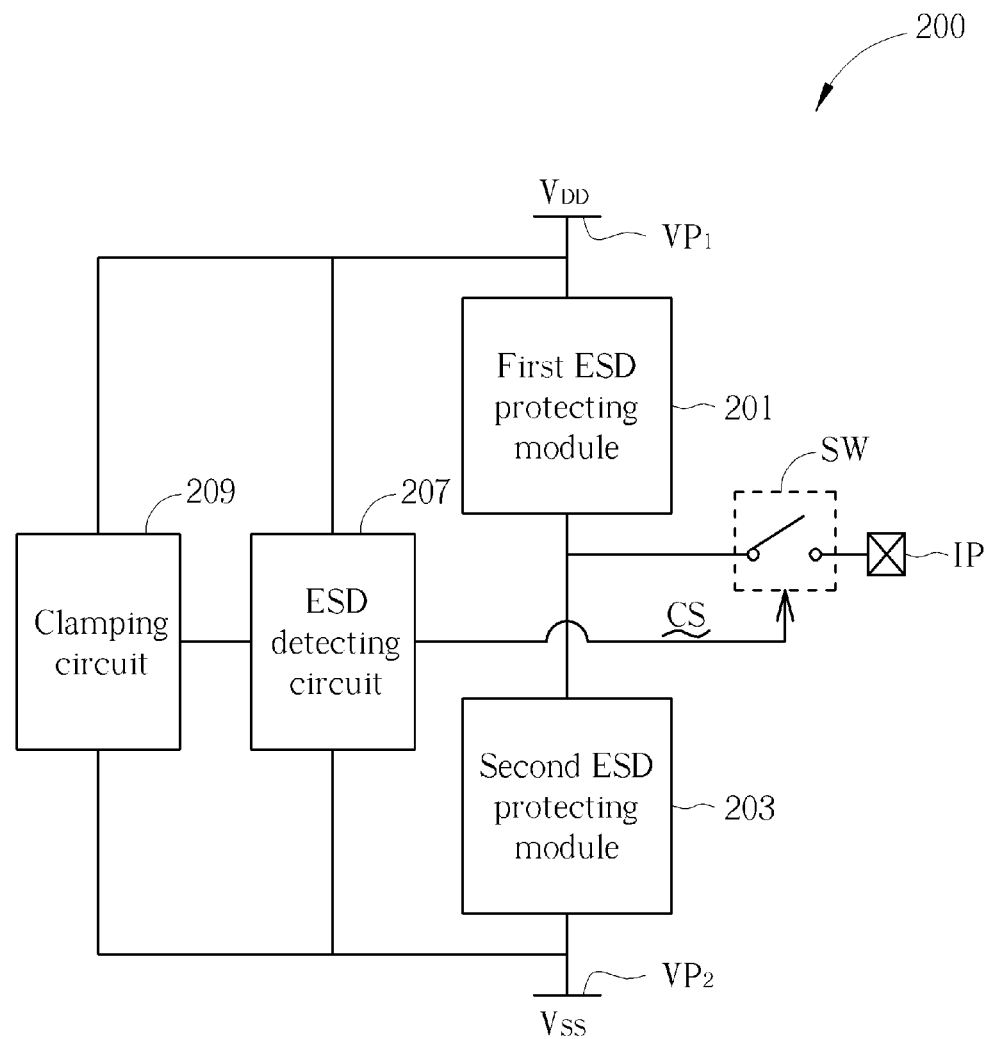
FIG. 2 is a block diagram illustrating an ESD protecting circuit according to one embodiment of the present application.

FIG. 2 is a circuit diagram illustrating an ESD protecting circuit 200 according to one embodiment of the present application. As shown in FIG. 2, the ESD protecting circuit 200 comprises a first ESD protecting module 201, a second ESD protecting module 203, an I/O pad IP, a first voltage pad $VP_1$, a second voltage pad $VP_2$, an ESD detecting circuit 207 and a switch SW (in this example, a MOS transistor). The first ESD protecting module 201 comprises a first terminal coupled to the first voltage pad $VP_1$. The second ESD protecting module 203 comprises a first terminal coupled to the first terminal of the switch SW, and comprises a second terminal coupled to the second voltage pad $VP_2$. The switch SW comprises a first terminal coupled to the second terminal of the first ESD protecting module, comprises a second terminal coupled to the I/O pad IP, and comprises a control terminal for receiving a control signal CS. The control signal CS controls the switch SW to be conductive or to be non-conductive. None of the first terminal and the second terminal for the switch SW is directly connected to a power or a ground level. The ESD detecting circuit 207 detects if an ESD voltage exists, for generating the control signal CS to control the switch SW to be conductive when an ESD voltage is detected and to control the switch SW to be nonconductive when the ESD voltage is not detected.

Since the switch SW is non-conductive in the normal mode (i.e. ESD voltage does not exist), the ESD protecting circuit 200 is isolated from the internal circuit in the normal mode. Therefore, the swing for the signal is no longer limited to a range between 0 and $V_{DD}$. In this embodiment, the ESD protecting circuit 200 further comprises a clamping circuit 209 for clamping the device of the ESD detecting circuit 207 to operate on a suitable voltage. However, it is not limited that the ESD detecting circuit 207 must comprise the clamping circuit 209.

Figure 3:
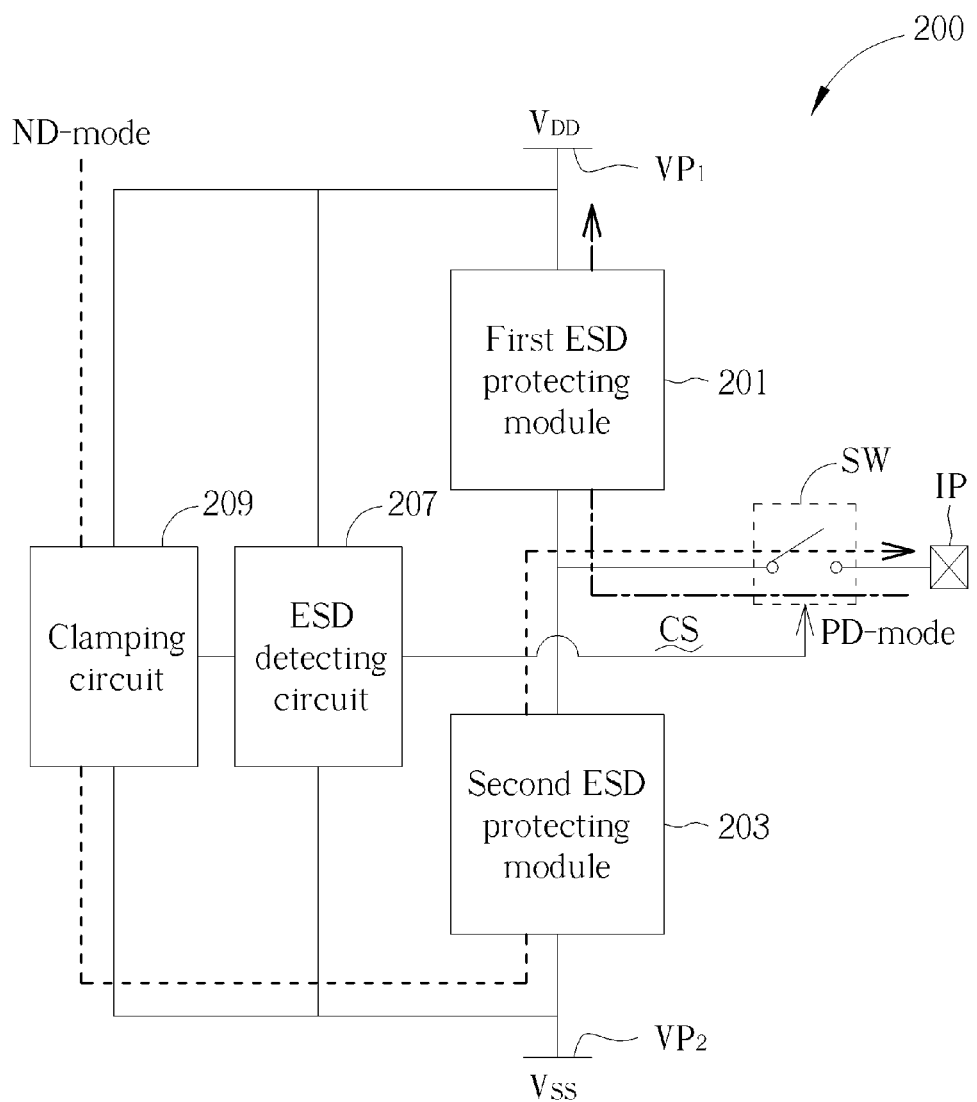
FIG. 3 and FIG. 4 explain the possible ESD paths for the embodiment depicted in FIG. 2.
Figure 4:
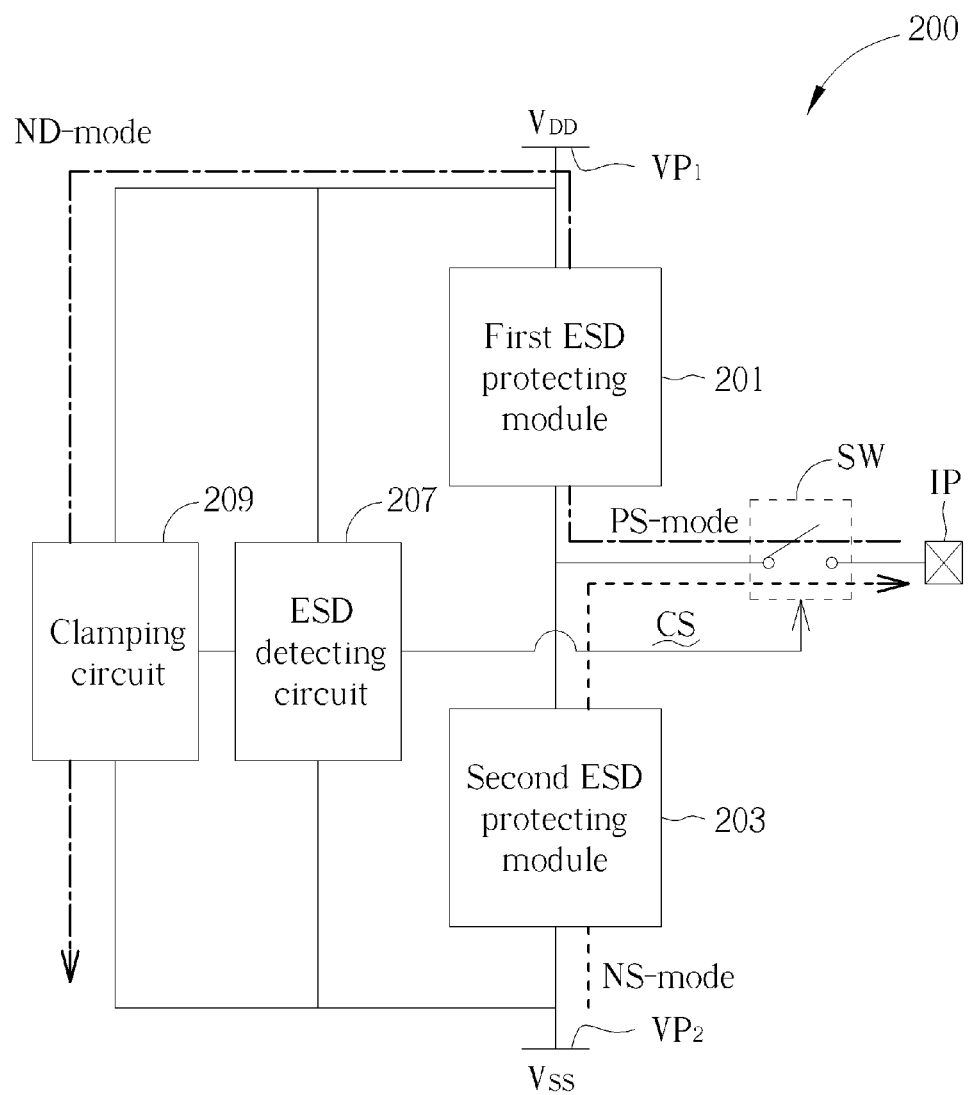

Some examples for the ESD paths of the embodiment in FIG. 2 are described in FIG. 3 and FIG. 4. As shown in FIG. 3, in the PD-mode, a positive ESD voltage occurs at the I/O pad IP, and discharges to the first voltage pad $VP_1$ which is coupled to the ground. The ESD path for the PD-mode passes through the first ESD protecting module 201. In the ND-mode, a negative ESD voltage occurs at the I/O pad IP, and discharges to the first voltage pad $VP_1$ which is coupled to the ground. The ESD path for the ND-mode passes through the clamping circuit 209 and the second ESD protecting module 203. As shown in FIG. 4, in the PS-mode, a positive ESD voltage occurs at the I/O pad IP, and discharges to the second voltage pad $VP_2$ which is coupled to the ground. The ESD path for the PS-mode passes through the first ESD protecting module 201 and the clamping circuit 209. In the NS-mode, a negative ESD voltage occurs at the I/O pad IP, and discharges to the second voltage pad $VP_2$ which is coupled to the ground. The ESD path for the NS-mode passes through the second ESD protecting module 203.

Figure 5:
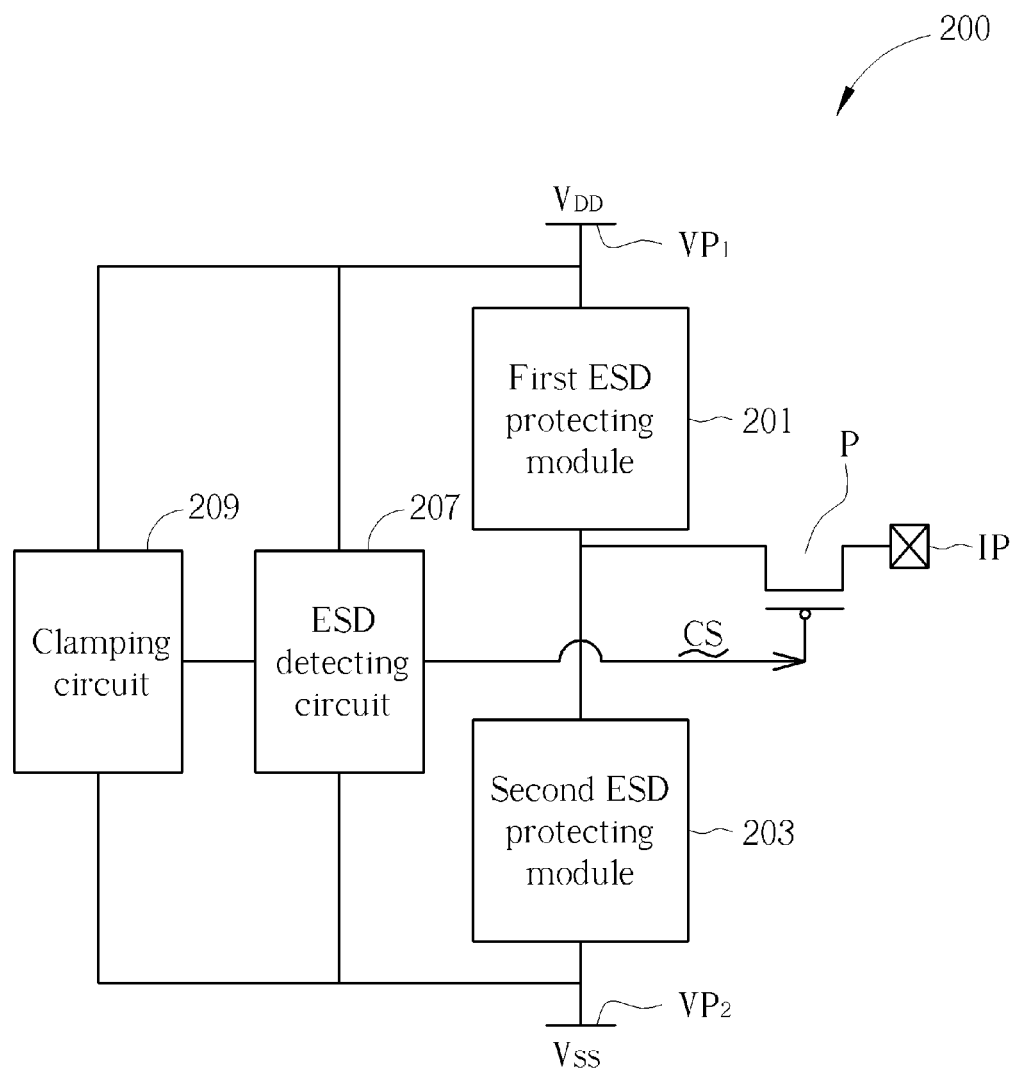
FIG. 5-FIG. 6 are circuit diagrams illustrating detail structures for the switch in the ESD protecting circuits according to different embodiments of the present application.
Figure 6:
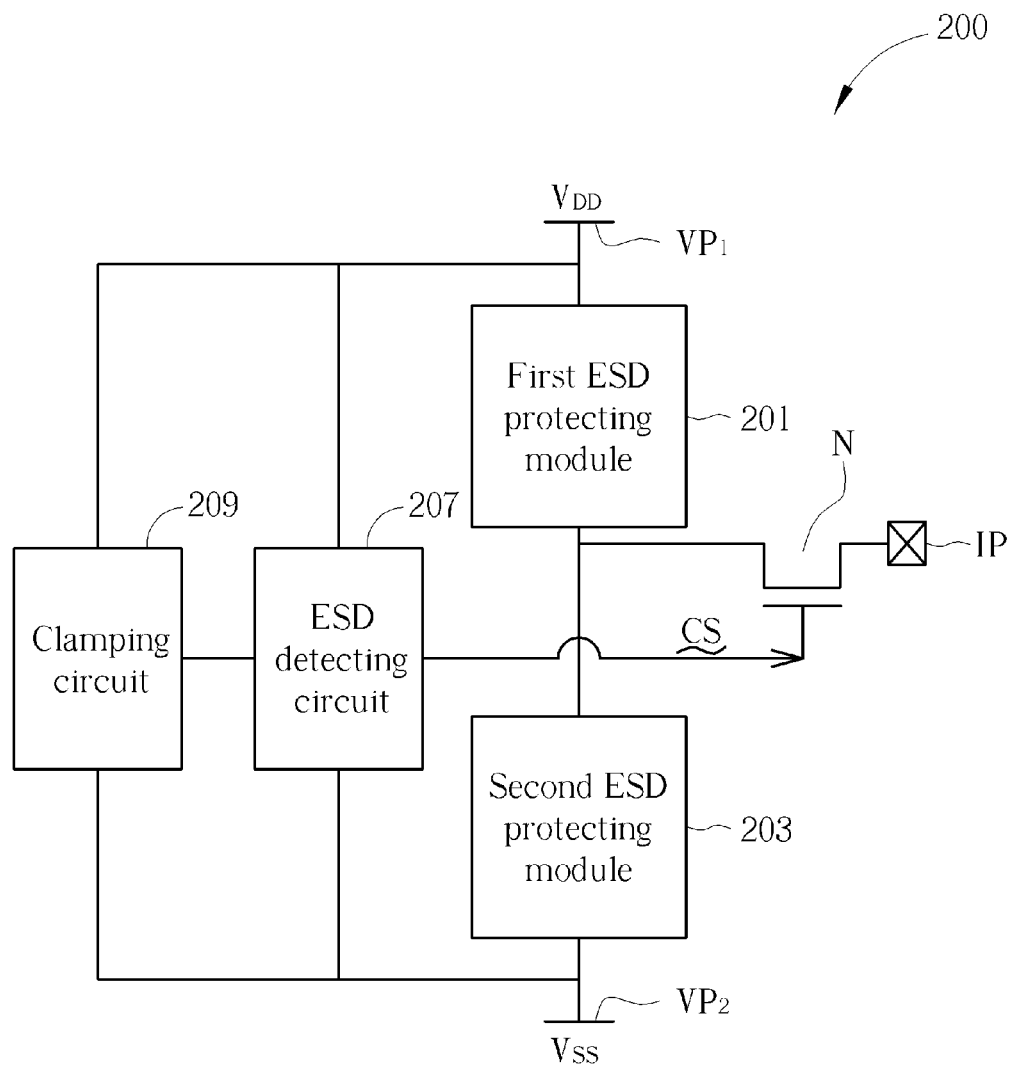

FIG. 5-FIG. 6 are circuit diagrams illustrating detail structures for the switch in the ESD protecting circuits according to different embodiments of the present application. In FIG. 5, a PMOS transistor P is utilizes as the switch SW in FIG. 2. The PMOS transistor P comprises a first terminal as the first terminal of the switch (i.e. the terminal coupled to the first ESD protecting module 201 and the second ESD protecting module 203), comprises a second terminal as the second terminal of the switch (i.e. the terminal coupled to the I/O pad IP), and comprises a gate terminal as the control terminal of the switch (i.e. the terminal receiving the control signal CS). Therefore, in the embodiment of FIG. 5, the ESD detecting circuit 207 generates a control signal CS having a negative voltage level to the PMOS transistor P to control the PMOS transistor P to be conductive, when the ESD detecting circuit 207 detects an ESD voltage. In the normal mode, the ESD detecting circuit 207 controls the PMOS transistor P to be non-conductive. In the embodiment of FIG. 6, an NMOS transistor N is utilized as the switch SW in the embodiment of FIG. 2. The NMOS transistor N comprises a first terminal as the first terminal of the switch (i.e. the terminal coupled to the first ESD protecting module 201 and the second ESD protecting module 203), comprises a second terminal as the second terminal of the switch (i.e. the terminal coupled to the I/O pad IP), and comprises agate terminal as the control terminal of the switch (i.e. the terminal receiving the control signal CS). Similarly, in the embodiment of FIG. 6, the ESD detecting circuit 207 generates a control signal CS having a positive voltage level to the NMOS transistor N to control the NMOS transistor N to be conductive, when the ESD detecting circuit 207 detects an ESD voltage. In the normal mode, the ESD detecting circuit 207 controls the NMOS transistor N to be non-conductive.

Figure 7:
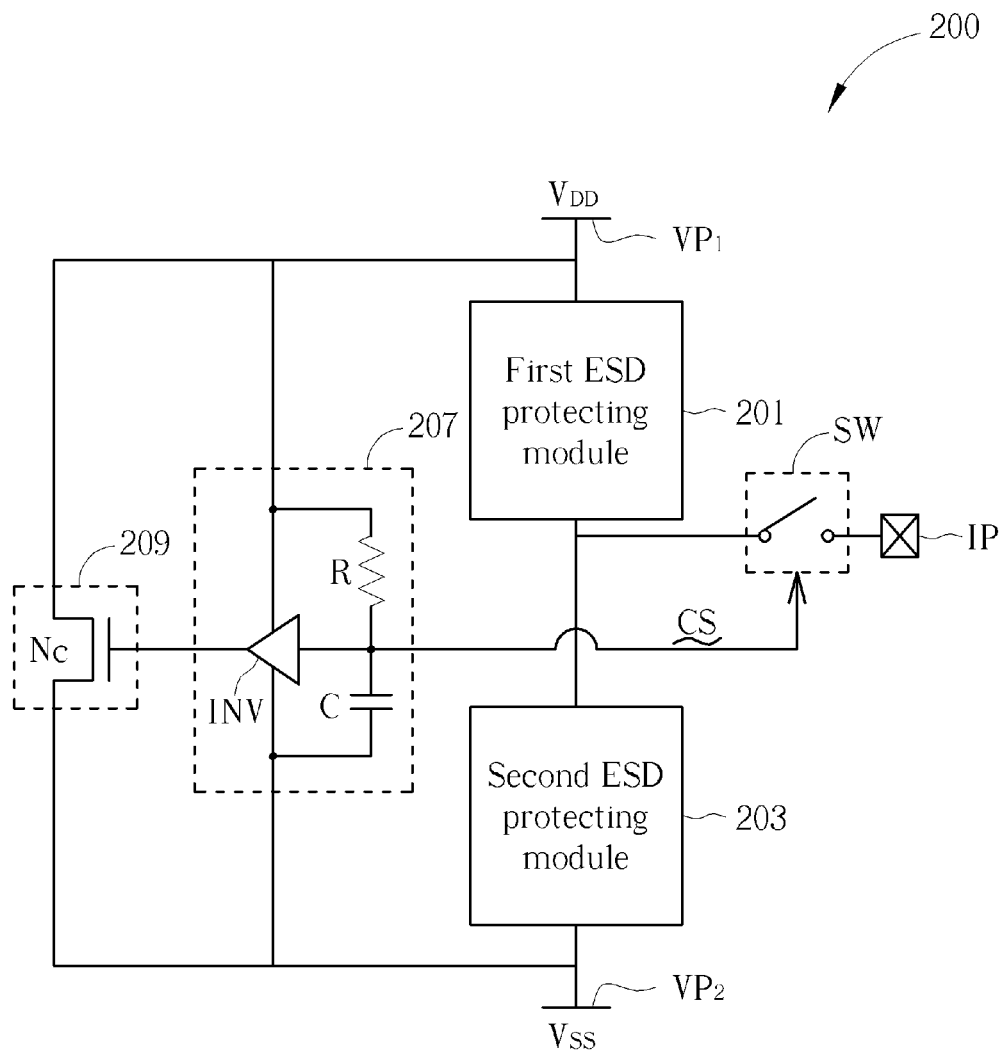
FIG. 7 is a circuit diagram illustrating detail structures for the ESD detecting circuit and the clamping circuit in the ESD protecting circuit according to one embodiment of the present application.

FIG. 7 is a circuit diagram illustrating detail structures for the ESD detecting circuit and the clamping circuit in the ESD protecting circuit according to different embodiments of the present application. In the embodiment of FIG. 7, the ESD detecting circuit 207 comprises an inverter INV, a resistor R and a capacitor C. Also, the clamping circuit 209 comprises a NMOS transistor $N_C$. However, the ESD detecting circuit 207 and the clamping circuit 209 can comprise other circuits, not limited in such embodiment.

Figure 8:
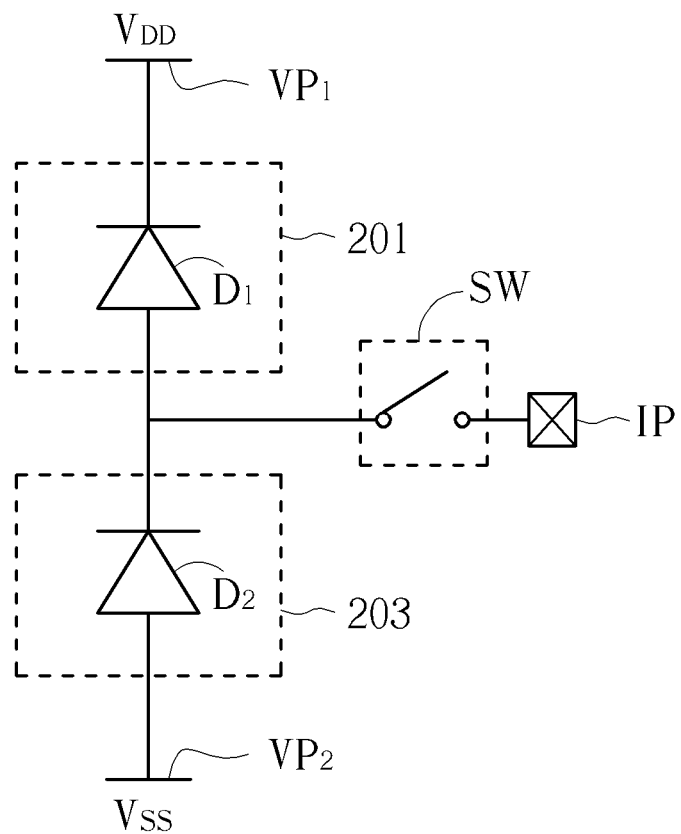
FIG. 8-FIG. 10 are circuit diagrams illustrating detail structures for the ESD protecting module in the ESD protecting circuits according to different embodiments of the present application.
Figure 9:
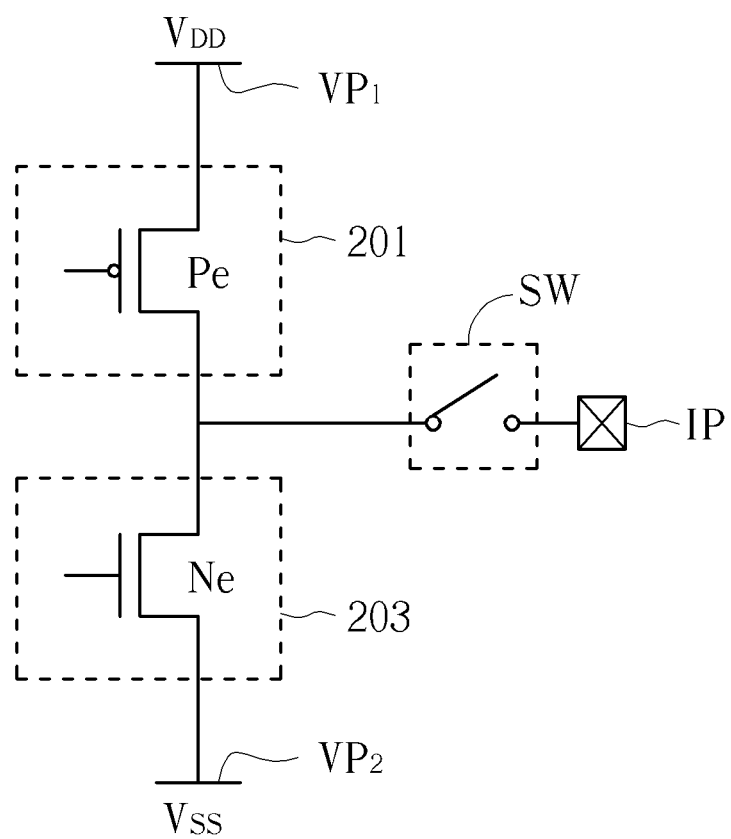
Figure 10:
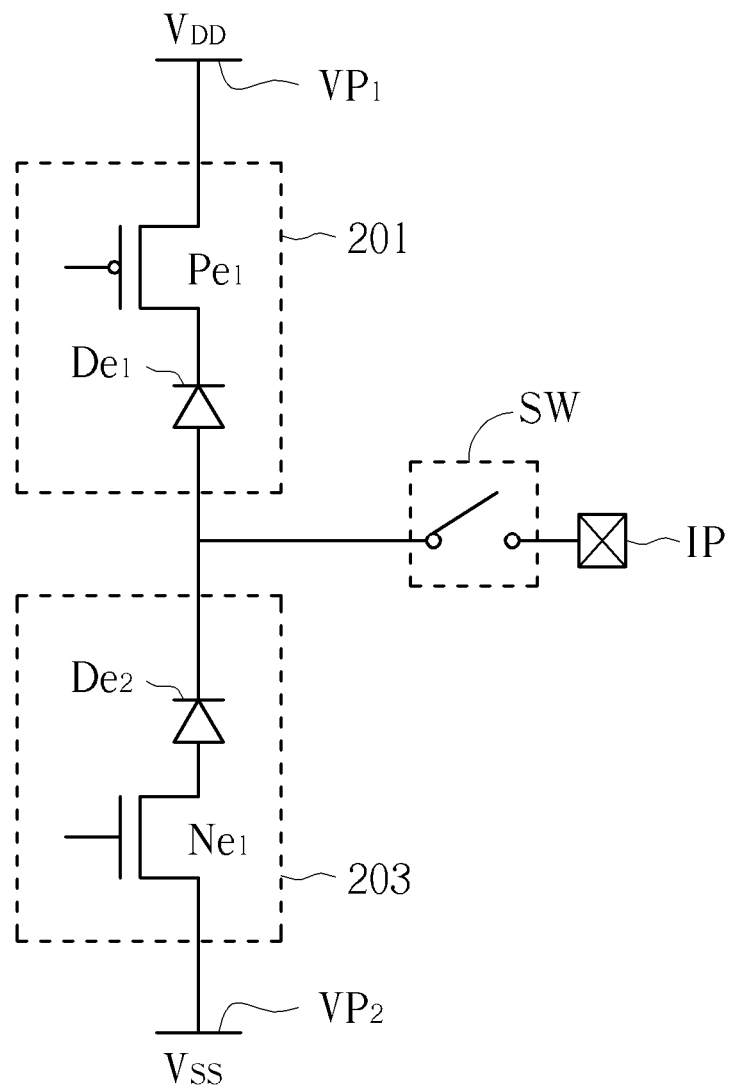

FIG. 8-FIG. 10 are circuit diagrams illustrating detail structures for the ESD protecting module in the ESD protecting circuits according to different embodiments of the present application. Please note some devices in FIG. 2 are not illustrated in FIG. 8-FIG. 10 for brevity. In FIG. 8, the first ESD protecting module 201 is a first diode $D_1$ comprising a cathode terminal as the first terminal of the first ESD protecting module 201 and comprising an anode terminal as the second terminal of the first ESD protecting module 201. The second ESD protecting module 203 is a second diode $D_2$ comprising a cathode terminal as the first terminal of the second ESD protecting module 203 and comprising an anode terminal as the second terminal of the second ESD protecting module 203. In FIG. 9, the first ESD protecting module 201 is a PMOS transistor $P_e$ comprising a first terminal as the first terminal of the first ESD protecting module 201, and comprising a second terminal as the second terminal of the first ESD protecting module 201. The second ESD protecting module 203 is a NMOS transistor $N_e$ comprising a first terminal as the first terminal of the second ESD protecting module 203, comprising a second terminal as the second terminal of the second ESD protecting module 203. In one embodiment, the gate terminals for the PMOS transistor $P_e$ and the NMOS transistor $N_e$ are coupled to the ESD detecting circuit 207 in FIG. 2 such that the ESD detecting circuit 207 can control the PMOS transistor $P_e$ or the NMOS transistor $N_e$ to be conductive when the ESD voltage occurs.

In FIG. 10, the first ESD protecting module 201 comprises a PMOS transistor $P_{e1}$ and a first diode $D_{e1}$. A first terminal of the PMOS transistor $P_{e1}$ is utilized as the first terminal of the first ESD protecting module 201 and a second terminal of the PMOS transistor $P_{e1}$ is coupled to a cathode terminal of the first diode $D_{e1}$. An anode terminal of the first diode $D_{e1}$ is utilized as the second terminal of the first ESD protecting module 201. The second ESD protecting module 203 comprises an NMOS transistor $N_{e1}$ and a second diode $D_{e2}$. A first terminal of the NMOS transistor $N_{e1}$ is coupled to an anode terminal of the second diode $D_{e2}$ and a second terminal of the NMOS transistor $N_{e1}$ is utilized as the second terminal of the second ESD protecting module 203. A cathode terminal of the second diode $D_{e2}$ is utilized as the first terminal of the second ESD protecting module 203. In one embodiment, the gate terminals for the PMOS transistor $P_{e1}$ and the NMOS transistor $N_{e1}$ are coupled to the ESD detecting circuit 207 in FIG. 2 such that the ESD detecting circuit 207 can control the PMOS transistor $P_{e1}$ or the NMOS transistor $N_{e1}$ to be conductive when the ESD voltage occurs.

In view of the abovementioned embodiment, the ESD protecting circuit can be isolated from the internal circuit such that the swing for the signal is no longer limited to a range between $V_{DD}$ and $V_{SS}$. Additionally, if a PMOS transistor is utilized as the switch, a mask for a deep N-well is no longer necessary, thus the cost can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An ESD protecting circuit, comprising:
a first voltage pad;
a second voltage pad;
an I/O pad;
a first ESD protecting module, comprising a first terminal coupled to the first voltage pad, and comprising a second terminal;
a switch, comprising a first terminal coupled to the second terminal of the first ESD protecting module, comprising a second terminal coupled to the I/O pad, and comprising a control terminal for receiving a control signal;

a second ESD protecting module, comprising a first terminal coupled to the first terminal of the switch, and comprising a second terminal coupled to the second voltage pad; and an ESD detecting circuit, for detecting if an ESD voltage exists, for generating the control signal to control the switch to be conductive when an ESD voltage is detected and to control the switch to be nonconductive when the ESD voltage is not detected.

2. The ESD protecting circuit of claim 1, wherein the switch is a PMOS transistor comprising a first terminal as the first terminal of the switch, comprising a second terminal as the second terminal of the switch, and comprising a gate terminal as the control terminal of the switch.

3. The ESD protecting circuit of claim 1, wherein the switch is a NMOS transistor comprising a first terminal as the first terminal of the switch, comprising a second terminal as the second terminal of the switch, and comprising a gate terminal as the control terminal of the switch.

4. The ESD protecting circuit of claim 1, wherein the first ESD protecting module is a first diode comprising a cathode terminal as the first terminal of the first ESD protecting module and comprising an anode terminal as the second terminal of the first ESD protecting module, where the second ESD protecting module is a second diode comprising a cathode terminal as the first terminal of the second ESD protecting module and comprising an anode terminal as the second terminal of the second ESD protecting module.

5. The ESD protecting circuit of claim 1, wherein the first ESD protecting module is a PMOS transistor comprising a first terminal as the first terminal of the first ESD protecting module, comprising a second terminal as the second terminal of the first ESD protecting module, where the second ESD protecting module is a NMOS transistor comprising a first terminal as the first terminal of the second ESD protecting module, comprising a second terminal as the second terminal of the second ESD protecting module.

6. The ESD protecting circuit of claim 1,
wherein the first ESD protecting module comprises a PMOS transistor and a first diode, where a first terminal of the PMOS transistor is utilized as the first terminal of the first ESD protecting module and a second terminal of the PMOS transistor is coupled to a cathode terminal of the first diode, wherein an anode terminal of the first diode is utilized as the second terminal of the first ESD protecting module;
wherein the second ESD protecting module comprises an NMOS transistor and a second diode, where a first terminal of the NMOS transistor is coupled to an anode terminal of the second diode and a second terminal of the NMOS transistor is utilized as the second terminal of the second ESD protecting module, wherein a cathode terminal of the second diode is utilized as the first terminal of the second ESD protecting module.

7. The ESD protecting circuit of claim 1, wherein none of the first terminal and the second terminal the switch is directly connected to a power or a ground level.

8. The ESD protecting circuit of claim 1, wherein a positive ESD voltage occurs at the I/O pad in a PD mode, and an ESD path passes through the first ESD protecting module in the PD mode.

9. The ESD protecting circuit of claim 1, wherein a negative ESD voltage occurs at the I/O pad in a NS mode, and an ESD path passes through the second ESD protecting module in the NS mode.

10. The ESD protecting circuit of claim 1, further comprising a clamping circuit configured to clamp the ESD detecting circuit to operate on a suitable voltage, wherein a negative ESD voltage occurs at the I/O pad in a ND mode, and an ESD path passes through the clamping circuit and the second ESD protecting module in the ND mode.

11. The ESD protecting circuit of claim 1, further comprising a clamping circuit configured to clamp the ESD detecting circuit to operate on a suitable voltage, wherein a positive ESD voltage occurs at the I/O pad in a PS mode, and an ESD path passes through the clamping circuit and the first ESD protecting module in the PS mode.

12. The ESD protecting circuit of claim 1, wherein the ESD detecting circuit comprises an inverter coupled to the first ESD protecting module and the second ESD protecting module, a resistor coupled to the inverter, and a capacitor coupled to the inverter.

13. The ESD protecting circuit of claim 1, further comprising a clamping circuit configured to clamp the ESD detecting circuit to operate on a suitable voltage, wherein the clamping circuit comprises a NMOS transistor coupled to the first ESD protecting module and the second ESD protecting module.

14. The ESD protecting circuit of claim 2, wherein the ESD detecting circuit generates the control signal having a negative voltage level to the switch to control the switch to be conductive when the ESD detecting circuit detects the ESD voltage.

15. The ESD protecting circuit of claim 3, wherein the ESD detecting circuit generates the control signal having a positive voltage level to the switch to control the switch to be conductive when the ESD detecting circuit detects the ESD voltage.

* * * * *